(12) United States Patent
Ko (10) Patent No.: US 10,541,045 B2
(45) Date of Patent: Jan. 21, 2020

(54) SEMICONDUCTOR APPARATUS RELATED TO THE REPAIRING OF A REDUNDANCY REGION

(71) Applicant: SK hynix Inc., Icheon-si, Gyeonggi-do (KR)

(72) Inventor: Keun Sik Ko, Seongnam-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/153,007

(22) Filed: Oct. 5, 2018

(65) Prior Publication Data

US 2019/0287641 A1    Sep. 19, 2019

(30) Foreign Application Priority Data

Mar. 13, 2018   (KR) .................. 10-2018-0029129

(51) Int. Cl.
*G11C 29/44* (2006.01)
*G11C 17/16* (2006.01)
*G11C 17/18* (2006.01)

(52) U.S. Cl.
CPC .......... *G11C 29/4401* (2013.01); *G11C 17/16* (2013.01); *G11C 17/18* (2013.01)

(58) Field of Classification Search
CPC ...... G11C 29/4401; G11C 17/18; G11C 17/16
See application file for complete search history.

(56) References Cited

U.S. PATENT DOCUMENTS 9,064,587 B2 *   6/2015   Blodgett .............. G11C 29/787
9,508,456 B1 *  11/2016   Shim .................... G11C 29/78

FOREIGN PATENT DOCUMENTS

KR        100649967 B1    11/2006
KR      1020160069222 A    6/2016

* cited by examiner

*Primary Examiner* — David Lam
(74) *Attorney, Agent, or Firm* — William Park & Associates Ltd.

(57) ABSTRACT

A semiconductor apparatus includes a fuse array, a word line decoder, a bit line decoder, a bank information comparison circuit, and a rupture circuit. The word line decoder is configured to select a word line of the fuse array based on a bank select address signal. The bit line decoder is configured to select a bit line of the fuse array based on a fail row address signal. The bank information comparison circuit and the rupture circuit are configured to rupture a fuse coupled to the word line and the bit line when a fail bank address signal and the bank select address signal correspond to each other.

19 Claims, 3 Drawing Sheets

SEMICONDUCTOR APPARATUS RELATED TO THE REPAIRING OF A REDUNDANCY REGION

CROSS-REFERENCES TO RELATED APPLICATION

The present application claims priority under 35 U.S.C. § 119(a) to Korean application number 10-2018-0029129, filed on Mar. 13, 2018, in the Korean Intellectual Property Office, which is incorporated herein by reference in its entirety as set forth in full.

BACKGROUND

1. Technical Field

Various exemplary embodiments may generally relate to a semiconductor technology and, more particularly, to a semiconductor apparatus and repair of a semiconductor apparatus.

2. Related Art

An electronic device includes a lot of electronic elements, and a computer system includes lots of semiconductor apparatuses comprising a semiconductor. A semiconductor apparatus generally includes data storage region configured to store data. The data storage region stores data in a location specified by an address. A defect may occur in the data storage region while fabricating the semiconductor apparatus. The semiconductor apparatus generally includes a repair circuit configured to replace and/or repair the data storage region in which defect occurs. The data storage region includes a normal region and a redundancy region. The repair circuit performs, when a defect occurs in the normal region, a repair operation of replacing an address related to the normal region where the defect occurs with an address of the redundancy region. The repair operation may be performed by rupturing a fuse capable of replacing the address of the normal region with the address of the redundancy region. The semiconductor apparatus includes an electrical fuse array and a circuit capable of programming the electrical fuse array according to error information.

SUMMARY

In an embodiment, a semiconductor apparatus may include: a fuse array; a word line decoder configured to select a word line of the fuse array based on a bank select address signal; a bit line decoder configured to select a bit line of the fuse array based on a fail row address signal; a bank information comparison circuit configured to generate a rupture enable signal by comparing a fail bank address signal with the bank select address signal; and a rupture circuit configured to rupture a fuse coupled to the selected word line and the selected bit line based on the rupture enable signal.

In an embodiment, a semiconductor apparatus may include: a plurality of memory banks each including a normal region and a redundancy region; a test circuit configured to test the redundancy region to detect when a defect occurs in a memory cell and generate a fail row address signal and a fail bank address signal based on the detection of the defect; and a redundancy repair circuit configured to select a fuse of a fuse array based on the fail row address signal and a bank select address signal, and to rupture the selected fuse when the fail bank address signal corresponds to the bank select address signal.

In an embodiment, a semiconductor apparatus may include: a word line decoder configured to select a word line based on a bank select address signal; a fail row latch circuit configured to sequentially store a plurality of fail row address signals based on an input control signal, and to output the plurality of fail row address signals based on a plurality of output control signals; a bit line decoder configured to select a bit line based on the fail row address signal; a fail bank latch circuit configured to sequentially store a plurality of fail bank address signals based on the input control signal, and to output the plurality of fail bank address signals based on the plurality of output control signals; a bank information comparison circuit configured to generate a rupture enable signal by comparing the fail bank address signal output from the fail bank latch circuit with the bank select address signal; and a rupture circuit configured to rupture a fuse coupled to the selected word line and the selected bit line based on the rupture enable signal.

BRIEF DESCRIPTION OF THE DRAWINGS

Features, aspects and embodiments are described in conjunction with the attached drawings, in which.

DETAILED DESCRIPTION

Hereinafter, a semiconductor apparatus will be described below with reference to the accompanying drawings through examples of embodiments.

Figure 1:
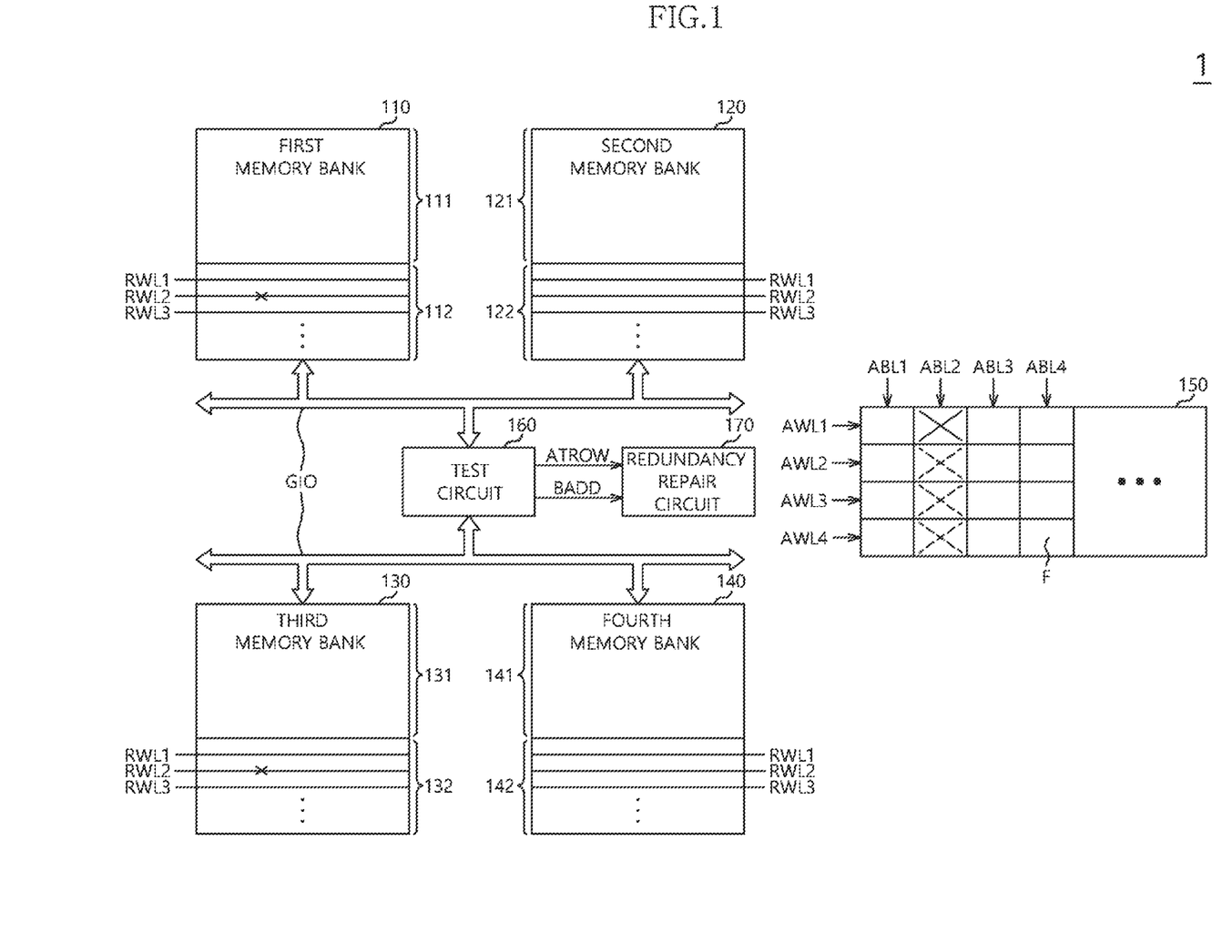
FIG. 1 is a diagram illustrating a representation of an example of a configuration of a semiconductor apparatus in accordance with an embodiment of the present disclosure.

FIG. 1 is a diagram illustrating a representation of an example of a configuration of a semiconductor apparatus 1 in accordance with an embodiment of the present disclosure. Referring to FIG. 1, the semiconductor apparatus 1 may include a data storage region. The data storage region may be a memory cell array. The memory cell array may include a plurality of memory banks. While FIG. 1 shows the semiconductor apparatus 1 including four memory banks, the number of the memory banks may be eight, sixteen or more. The plurality of memory banks may include a plurality of word lines (not illustrated) and a plurality of bit lines (not illustrated) and may include a plurality of memory cells (not illustrated) respectively coupled to cross points between the plurality of bit lines and the plurality of word lines. When a particular word line is selected among the plurality of word lines and a particular bit line is selected among the plurality of bit lines, a particular memory cell may be selected and accessed among the plurality of memory cells. The semiconductor apparatus 1 may write data into the selected memory cell or may read data stored in the selected memory cell. The memory cell may be implemented into various types. The memory cell may include one between a volatile memory cell and a non-volatile memory cell. The volatile memory cell may include a capacitor memory cell and a transistor latch memory cell. The non-volatile memory cell may include a phase change memory cell, a variable resistance memory cell, a magnetic resistance memory cell, a ferroelectric memory cell and so forth.

Referring to FIG. 1, the semiconductor apparatus 1 may include a first memory bank 110, a second memory bank 120, a third memory bank 130 and a fourth memory bank 140. The first to fourth memory banks 110, 120, 130 and 140 may respectively include normal regions 111, 121, 131 and 141 and redundancy regions 112, 122, 132 and 142. Data may be stored into or read from the normal regions 111, 121, 131 and 141 when the semiconductor apparatus 1 performs a normal operation, that is, a write operation or a read operation. The redundancy regions 112, 122, 132 and 142 may be provided to replace, when defect occurs in a memory cell of the normal regions 111, 121, 131 and 141, the memory cell of the defect with a memory cell in the redundancy regions 112, 122, 132 and 142. The redundancy regions 112, 122, 132 and 142 and the normal regions 111, 121, 131 and 141 might not be physically divided, and a part of the first to fourth memory banks 110, 120, 130 and 140 may be defined as the redundancy regions 112, 122, 132 and 142. Although FIG. 1 exemplifies the redundancy regions 112, 122, 132 and 142 each including a first word line RWL1, a second word line RWL2 and a third word line RWL3, the number of word lines included in each of the redundancy regions 112, 122, 132 and 142 will not be limited thereto and the number of word lines included in each of the redundancy regions 112, 122, 132 and 142 may be more than four.

The semiconductor apparatus 1 may perform a first test operation. The semiconductor apparatus 1 may detect a memory cell in which defect occurs in the normal regions 111, 121, 131 and 141 by performing the first test operation. The semiconductor apparatus 1 may perform a first repair operation. The semiconductor apparatus 1 may replace and/or repair a memory cell detected as failed in the normal regions 111, 121, 131 and 141 with a memory cell in the redundancy regions 112, 122, 132 and 142 by performing the first repair operation. The first repair operation may be performed by replacing a word line or a bit line coupled to the memory cell detected as failed in the normal regions 111, 121, 131 and 141 with a word line of the redundancy regions 112, 122, 132 and 142. Although the repair operation of replacing a word line is described as an example in this disclosure, an embodiment of the present disclosure will not be limited thereto and the repair operation of replacing a bit line may also be included in the scope of the present disclosure.

The semiconductor apparatus 1 may include a fuse array 150. The fuse array 150 may store replacement and/or repair information of a word line of the redundancy regions 112, 122, 132 and 142 replacing a word line of the normal regions 111, 121, 131 and 141 according to a result of the first repair operation. That is, the fuse array 150 may store matching information between a word line coupled to a memory cell detected as failed in the normal regions 111, 121, 131 and 141 and a word line of the redundancy regions 112, 122, 132 and 142. The fuse array 150 may include a plurality of word lines AWL1, AWL2, AWL3 and AWL4 and a plurality of bit lines ABL1, ABL2 and ABL3. The fuse array 150 may include a plurality of fuses F respectively coupled to cross points between the plurality of word lines AWL1, AWL2, AWL3 and AWL4 and the plurality of bit lines ABL1, ABL2 and ABL3. Each of the plurality of fuses F may be an electrical fuse or an anti-fuse. The fuse array 150 may be an electrical fuse array.

The semiconductor apparatus 1 may perform a test operation to the redundancy regions 112, 122, 132 and 142. The test operation may be a second test operation. The semiconductor apparatus 1 may detect a memory cell in which a defect occurs in the redundancy regions 112, 122, 132 and 142 by performing the second test operation. The semiconductor apparatus 1 may disable, when a memory cell is detected as having a defect in the redundancy regions 112, 122, 132 and 142, a fuse corresponding to a word line coupled to the memory cell detected as failed in the redundancy regions 112, 122, 132 and 142. The semiconductor apparatus 1 may disable the fuse corresponding to a word line coupled to the memory cell detected as failed in the redundancy regions 112, 122, 132 and 142 by rupturing the fuse. The operation of rupturing the fuse may be a second repair operation. The semiconductor apparatus 1 may prevent, by performing the second repair operation, the first repair operation of replacing and/or repairing a word line coupled to a memory cell detected as failed in the normal regions 111, 121, 131 and 141 with a word line coupled to a memory cell detected as failed in the redundancy regions 112, 122, 132 and 142. The second test operation and the second repair operation may be performed before or at the same time when the first test operation and the first repair operation are performed.

Referring to FIG. 1, the semiconductor apparatus 1 may further include a test circuit 160 and a redundancy repair circuit 170. The test circuit 160 may be provided for the second test operation and the redundancy repair circuit 170 may be provided for the second repair operation. The test circuit 160 may perform a test operation of detecting a memory cell in which a defect occurs in the redundancy regions 112, 122, 132 and 142. For example, the test circuit 160 may perform a test operation of detecting a memory cell in which a defect occurs in the redundancy regions 112, 122, 132 and 142 by writing data of the same level into memory cells of the redundancy regions 112, 122, 132 and 142 and reading at the same time data stored in the memory cells of the redundancy regions 112, 122, 132 and 142. For example, the test circuit 160 may write logic '1' data into memory cells of the redundancy regions 112, 122, 132 and 142 and may detect a memory cell, which cannot output the logic '1' data, as having a defect. The semiconductor apparatus 1 may include a global line GIO provided at a peripheral region between the first to fourth memory banks 110, 120, 130 and 140. The test circuit 160 may write data into memory cells of the redundancy regions 112, 122, 132 and 142 by providing the data through the global line GIO. Also, the test circuit 160 may receive data read from memory cells of the redundancy regions 112, 122, 132 and 142 through the global line GIO. The test circuit 160 may generate a fail row address signal ATROW and a fail bank address signal BADD by determining data provided through the global line GIO. The fail row address signal ATROW may include information indicating a word line coupled to a memory cell in which defect occurs. The fail bank address signal BADD may include information indicating a memory bank in which a word line coupled to a memory cell in which defect occurs is provided. For example, the fail row address signal ATROW may be information for selecting a bit line of the fuse array 150.

The redundancy repair circuit 170 may receive the fail row address signal ATROW and the fail bank address signal BADD from the test circuit 160. The redundancy repair circuit 170 may rupture a particular fuse based on the fail row address signal ATROW and the fail bank address signal BADD. In accordance with an embodiment, the redundancy repair circuit 170 may sequentially perform a rupture operation to the respective first to fourth memory banks 110, 120, 130 and 140 based on the fail row address signal ATROW. For example, the fuse array 150 may include four numbers of word lines AWL1, AWL2, AWL3 and AWL4 and three or more numbers of bit lines ABL1, ABL2 and ABL3. The four numbers of word lines AWL1, AWL2, AWL3 and AWL4 may be matched to the first to fourth memory banks 110, 120, 130 and 140, respectively. The three or more numbers of bit lines ABL1, ABL2 and ABL3 may be matched to word lines coupled to memory cells of defect in the redundancy regions 112, 122, 132 and 142 of the first to fourth memory banks 110, 120, 130 and 140. For example, when a defect occurs in a memory cell coupled to the second word line RWL2 in the redundancy region 112 of the first memory bank 110, the test circuit 160 and the redundancy repair circuit 170 may rupture a fuse coupled to the first word line AWL1 and the second bit line ABL2 of the fuse array 150. For example, when a defect occurs in a memory cell coupled to the third word line RWL3 in the redundancy region 122 of the second memory bank 120, the test circuit 160 and the redundancy repair circuit 170 may rupture a fuse coupled to the second word line AWL2 and the third bit line ABL3 of the fuse array 150.

The second repair operation may be generally performed without using the fail bank address signal BADD and thus all of fuses coupled to a particular bit line of the fuse array 150 are ruptured. For example, when a defect occurs in a memory cell coupled to the second word line RWL2 in the redundancy region 112 of the first memory bank 110, all fuses coupled to the second bit line ABL2 of the fuse array 150 are ruptured. Therefore, all fuses respectively coupled to the second bit line ABL2 and even the second to fourth word lines AWL2, AWL3 and AWL4 are ruptured and thus the repair efficiency of the fuse array 150 are reduced since the fuses respectively coupled to the second bit line ABL2 and the second to fourth word lines AWL2, AWL3 and AWL4 cannot be used for the first repair operation. In accordance with an embodiment, the semiconductor apparatus 1 may sequentially perform a rupture operation to each of the plurality of memory banks and thus may selectively rupture a fuse corresponding to a selected memory bank and a selected word line.

Figure 2:
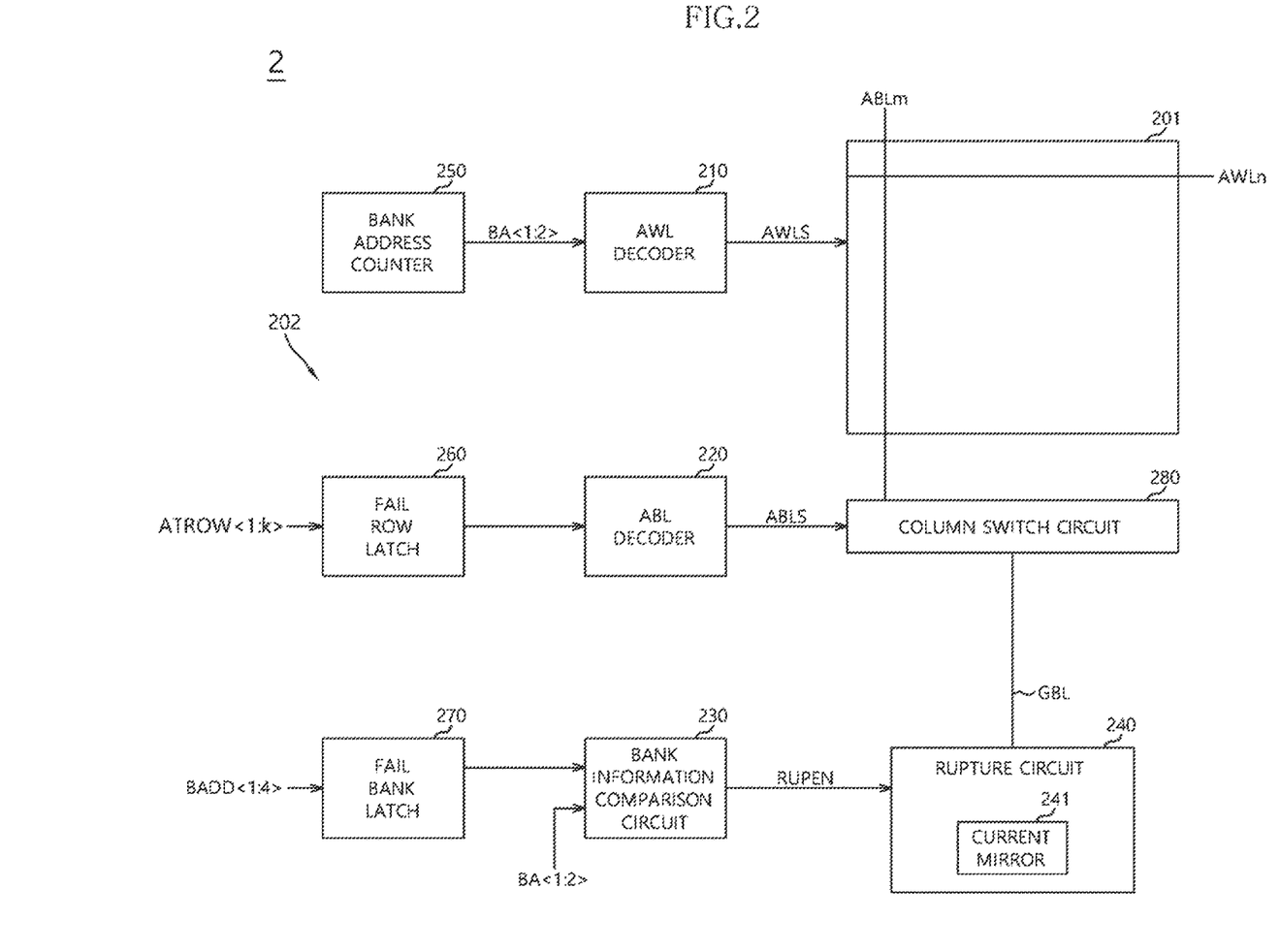
FIG. 2 is a diagram illustrating a representation of an example of a configuration of a semiconductor apparatus including a fuse array and a redundancy repair circuit in accordance with an embodiment of the present disclosure.

FIG. 2 is a diagram illustrating a representation of an example of a configuration of a semiconductor apparatus 2 in accordance with an embodiment of the present disclosure. The semiconductor apparatus 2 may include a fuse array 201 and a redundancy repair circuit 202. The fuse array 201 may include a plurality of word lines and a plurality of bit lines. FIG. 2 illustrates an arbitrary word line AWLn (n is an integer of 2 or greater) and an arbitrary bit line ABLm (m is an integer of 2 or greater). The fuse array 201 may include a plurality of fuses respectively coupled to cross points between the plurality of word lines AWLn and the plurality of bit lines ABLm. The fuse array 201 may correspond to the fuse array 150 illustrated in FIG. 1. The redundancy repair circuit 202 may receive the fail row address signal ATROW<1:k> (k is an integer of 2 or greater) and the fail bank address signal BADD<1:4> from the test circuit 160 illustrated in FIG. 1. The redundancy repair circuit 202 may selectively rupture a fuse of the fuse array 201 based on the fail row address signal ATROW<1:k> and the fail bank address signal BADD<1:4>. The redundancy repair circuit 202 may generate a bank select address signal BA<1:2>. The redundancy repair circuit 202 may select a fuse of the fuse array 201 based on the fail row address signal ATROW<1:k> and the bank select address signal BA<1:2> and may rupture the selected fuse based on whether the fail bank address signal BADD<1:4> corresponds to the bank select address signal BA<1:2>. For example, the redundancy repair circuit 202 may rupture the selected fuse when the fail bank address signal BADD<1:4> corresponds to the bank select address signal BA<1:2> and might not rupture the selected fuse when the fail bank address signal BADD<1:4> does not correspond to the bank select address signal BA<1:2>.

Referring to FIG. 2, the redundancy repair circuit 202 may include a word line decoder (AWL decoder) 210, a bit line decoder (ABL decoder) 220, a bank information comparison circuit 230 and a rupture circuit 240. The word line decoder 210 may receive the bank select address signal BA<1:2>. The word line decoder 210 may generate a word line selection signal AWLS based on the bank select address signal BA<1:2>. The word line decoder 210 may generate the word line selection signal AWLS for selecting a particular word line of the fuse array 201 by decoding the bank select address signal BA<1:2>. The word line selection signal AWLS may enable a particular word line among the plurality of word lines AWLn according to the bank select address signal BA<1:2>. For example, a number of word lines of the fuse array 201 may correspond to a number of memory banks of the semiconductor apparatus 2. Since the semiconductor apparatus 1 is exemplified as including four numbers of memory banks 110, 120, 130 and 140, the bank select address signal BA<1:2> may be a two-bit signal.

The bit line decoder 220 may receive the fail row address signal ATROW<1:k>. The bit line decoder 220 may generate a bit line selection signal ABLS based on the fail row address signal ATROW<1:k>. The bit line decoder 220 may generate the bit line selection signal ABLS for selecting a particular bit line of the fuse array 201 by decoding the fail row address signal ATROW<1:k>. The bit line selection signal ABLS may enable a particular bit line among the plurality of bit lines ABLm according to the fail row address signal ATROW<1:k>. The fail row address signal ATROW<1:k> may have bits, a number of which corresponds to a number of the plurality of bit lines ABLm. For example, when the number of the plurality of bit lines ABLm is 32, the fail row address signal ATROW<1:k> may be a five-bit signal.

The bank information comparison circuit 230 may receive the bank select address signal BA<1:2> and the fail bank address signal BADD<1:4>. The bank information comparison circuit 230 may generate a rupture enable signal RUPEN by comparing the bank select address signal BA<1:2> and the fail bank address signal BADD<1:4>. The bank information comparison circuit 230 may enable the rupture enable signal RUPEN when the fail bank address signal BADD<1:4> and the bank select address signal BA<1:2> correspond to each other and may disable the rupture enable signal RUPEN when the fail bank address signal BADD<1: 4> and the bank select address signal BA<1:2> do not correspond to each other. The bank information comparison circuit 230 may selectively enable the rupture enable signal RUPEN according to whether logic levels of a bit of a particular turn of the fail bank address signal BADD<1:4> and a bit of a particular turn of a decoded signal of the bank select address signal BA<1:2> correspond to each other. For example, the fail bank address signal BADD<1:4> may have bits, the number of which corresponds to the number of memory banks included in the semiconductor apparatus 2. For example, the fail bank address signal BADD<1:4> may be a four-bit signal. The bits of the fail bank address signal BADD<1:4> may respectively correspond to the first to fourth memory banks 110, 120, 130 and 140 illustrated in FIG. 1, For example, the bit of the fail bank address signal BADD<1:4> corresponding to a memory bank including a failed memory cell may be 1 and the bit of the fail bank address signal BADD<1:4> corresponding to a memory bank not including any failed memory cell may be 0. The bank information comparison circuit 230 may generate a four-bit decoded signal by decoding the bank select address signal BA<1:2>. The bank information comparison circuit 230 may compare a bit of a particular turn of the fail bank address signal BADD<1:4> and a bit of a particular turn of the decoded signal of the bank select address signal BA<1:2> and may enable the rupture enable signal RUPEN according to whether the bit of a particular turn of the fail bank address signal BADD<1:4> and the bit of a particular turn of the decoded signal of the bank select address signal BA<1:2> have logic levels corresponding to each other. For example, when all of the bits of the particular turns are 1, the bank information comparison circuit 230 may enable the rupture enable signal RUPEN. When only one of the bits of the particular turns is 1 or all of the bits of the particular turns are 0, the bank information comparison circuit 230 may disable the rupture enable signal RUPEN.

The rupture circuit 240 may be coupled to a selected bit line of the fuse array 201. For example, the rupture circuit 240 may be coupled to the bit line selected through a global bit line GBL selectively coupled to the plurality of bit lines ABLm. The rupture circuit 240 may receive the rupture enable signal RUPEN from the bank information comparison circuit 230. The rupture circuit 240 may rupture a fuse coupled to a selected bit line of the fuse array 201 by allowing current to flow through the global bit line GBL when the rupture enable signal RUPEN is enabled. The rupture circuit 240 might not rupture a fuse coupled to the selected bit line of the fuse array 201 by preventing current from flowing through the global bit line GBL when the rupture enable signal RUPEN is disabled. The rupture circuit 240 may include a current mirror 241. The current mirror 241 may form a current path for current, which is sufficient for the fuse to be ruptured, to flow through the global bit line GBL when the rupture enable signal RUPEN is enabled.

Referring to FIG. 2, the redundancy repair circuit 202 may further include a bank address counter 250, a fail row latch 260, a fail bank latch 270 and a column switch circuit 280. The bank address counter 250 may generate the bank select address signal BA<1:2>. The bank address counter 250 may sequentially change a code value of the bank select address signal BA<1:2> at each predetermined time. For example, the bank address counter 250 may sequentially increase the code value of the bank select address signal BA<1:2> at each predetermined time. The predetermined time may correspond to a time when a particular fuse of the fuse array 201 is selected and the particular fuse is ruptured or may be greater than the time when a particular fuse of the fuse array 201 is selected and the particular fuse is ruptured. The bank address counter 250 may sequentially select the four numbers of word lines AWL1, AWL2, AWL3 and AWL4 by sequentially increasing the code value of the bank select address signal BA<1:2>. Therefore, the repair operation may be sequentially performed to the redundancy regions 112, 122, 132 and 142 of the first to fourth memory banks 110, 120, 130 and 140.

The word "predetermined" as used herein with respect to a parameter, such as a predetermined time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The fail row latch 260 may receive and store the fail row address signal ATROW<1:k>. The fail row latch 260 may temporarily store the fail row address signal ATROW<1:k>. The fail row latch 260 may output the stored fail row address signal ATROW<1:k> to the bit line decoder 220. The fail bank latch 270 may receive and store the fail bank address signal BADD<1:4>. The fail bank latch 270 may temporarily store the fail bank address signal BADD<1:4>. The fail bank latch 270 may output the stored fail bank address signal BADD<1:4> to the bank information comparison circuit 230.

The column switch circuit 280 may receive the bit line selection signal ABLS from the bit line decoder 220. The column switch circuit 280 may couple one among the plurality of bit lines ABLm to the global bit line GBL based on the bit line selection signal ABLS. The column switch circuit 280 may couple the bit line selected on the basis of the bit line selection signal ABLS to the rupture circuit 240 through the global bit line GBL.

Described as follows with reference to FIGS. 1 and 2 will be the semiconductor apparatus 1 and 2 in accordance with an embodiment. The test circuit 160 may perform a test operation to the redundancy regions 112, 122, 132 and 142 of the first to fourth memory banks 110, 120, 130 and 140 and may generate the fail row address signal ATROW<1:k> and the fail bank address signal BADD<1:4> according to the result of the test operation. For example, it is assumed that there is an occurrence of defects in memory cells coupled to the second word line RWL2 of the first memory bank 110 and the second word line RWL2 of the third memory bank 130 while no defects occur in memory cells of the second and fourth memory banks 120 and 140. The test circuit 160 may generate a particular fail row address signal ATROW<1:k> for mapping the second word line RWL2 to the bit line of the fuse array 201. Further, the test circuit 160 may generate the fail bank address signal BADD<1:4> having a code value '0, 1, 0, 1' as an example. The least significant bit of the fail bank address signal BADD<1:4> may correspond to repair information for the redundancy region 112 of the first memory bank 110, the second bit of the fail bank address signal BADD<1:4> may correspond to repair information for the redundancy region 122 of the second memory bank 120, the third bit of the fail bank address signal BADD<1:4> may correspond to repair information for the redundancy region 132 of the third memory bank 130, and the most significant bit of the fail bank address signal BADD<1:4> may correspond to repair information for the redundancy region 142 of the fourth memory bank 140. The test circuit 160 may generate the fail bank address signal BADD<1:4> by setting the least significant bit and the third bit respectively to one (1) since defects occur in memory cells of the first and third memory bank 110 and 130.

The redundancy repair circuit 202 may sequentially perform a repair operation to the first to fourth memory banks 110, 120, 130 and 140. For example, the bank address counter 250 may generate the bank select address signal BA<1:2> having the smallest code value for selecting the first word line AWL1. Therefore, the repair operation may be first performed to the redundancy region 112 of the first memory bank 110. The word line decoder 210 may enable the first word line AWL1 based on the bank select address signal BA<1:2>. The bit line decoder 220 may generate the bit line selection signal ABLS based on the fail row address signal ATROW<1:k>. A particular bit line, for example, the second bit line ABL2 may be coupled to the global bit line GBL through the column switch circuit 280 based on the bit line selection signal ABLS.

The bank information comparison circuit 230 may compare a decoded signal of the bank select address signal BA<1:2> with the fail bank address signal BADD<1:4>. The decoded signal of the bank select address signal BA<1:2> may have a code value '0, 0, 0, 1' and may be compared with the fail bank address signal BADD<1:4> having the code value of '0, 1, 0, 1'. Since both of the least significant bit of the decoded signal of the bank select address signal BA<1:2> and the least significant bit of the fail bank address signal BADD<1:4> are logic '1', the bank information comparison circuit 230 may enable the rupture enable signal RU PEN. The rupture circuit 240 may allow current to flow through the global bit line GBL based on the enabled rupture enable signal RUPEN. Therefore, the fuse F coupled to the first word line AWL1 and the second bit line ABL2 may be ruptured by the rupture circuit 240. As the fuse F coupled to the first word line AWL1 and the second bit line ABL2 is ruptured, the second word line RWL2 of the redundancy region 112 of the first memory bank 110 might not be used for replacing a defect occurring in the normal region 111.

After that, the repair operation may be performed to the redundancy region 122 of the second memory bank 120. After a predetermined amount of time, the bank address counter 250 may increase the code value of the bank select address signal BA<1:2> by an amount of 1. The word line decoder 210 may select the second word line AWL2 by generating the word line selection signal AWLS based on the bank select address signal BA<1:2>. The bank information comparison circuit 230 may compare the decoded signal of the bank select address signal BA<1:2> with the fail bank address signal BADD<1:4>. The decoded signal of the bank select address signal BA<1:2> may have a code value '0, 0, 1, 0' and may be compared with the fail bank address signal BADD<1:4> having the code value of '0, 1, 0, 1'. Since the value of the second bit of the decoded signal is logic '1' while the value of the second bit of the fail bank address signal BADD<1:4> is logic '0', the bank information comparison circuit 230 may disable the rupture enable signal RUPEN. Therefore, the fuse F coupled to the second word line AWL2 might not be ruptured.

After a predetermined amount of time again, the bank address counter 250 may increase the code value of the bank select address signal BA<1:2> by an amount of 1 and the repair operation may be performed to the redundancy region 132 of the third memory bank 130. The word line decoder 210 may select the third word line AWL3 by generating the word line selection signal AWLS based on the bank select address signal BA<1:2>. The bit line decoder 220 may select the second bit line ABL2 based on the fail row address signal ATROW<1:k>. The second bit line ABL2 may be coupled to the global bit line GBL through the column switch circuit 280. The bank information comparison circuit 230 may compare the decoded signal of the bank select address signal BA<1:2> with the fail bank address signal BADD<1:4>, The decoded signal of the bank select address signal BA<1:2> may have a code value '0, 1, 0, 0' and may be compared with the fail bank address signal BADD<1:4> having the code value of '0, 1, 0, 1'. Since both of the third bit of the decoded signal of the bank select address signal BA<1:2> and the third bit of the fail bank address signal BADD<1:4> are logic '1', the bank information comparison circuit 230 may enable the rupture enable signal RUPEN. The rupture circuit 240 may allow current to flow through the global bit line GBL based on the enabled rupture enable signal RUPEN. Therefore, the fuse F coupled to the third word line AWL3 and the second bit line ABL2 may be ruptured by the rupture circuit 240. As the fuse F coupled to the third word line AWLS and the second bit line ABL2 is ruptured, the second word line RWL2 of the redundancy region 132 of the third memory bank 130 might not be used for replacing a defect occurring in the normal region 131.

After a predetermined amount of time, further again, the bank address counter 250 may increase the code value of the bank select address signal BA<1:2> by an amount of 1 and the repair operation may be performed to the redundancy region 142 of the fourth memory bank 140. The word line decoder 210 may select the fourth word line AWL4 by generating the word line selection signal AWLS based on the bank select address signal BA<1:2>. The bank information comparison circuit 230 may compare the decoded signal of the bank select address signal BA<1:2> with the fail bank address signal BADD<1:4>. The decoded signal of the bank select address signal BA<1:2> may have a code value '1, 0, 0, 0' and may be compared with the fail bank address signal BADD<1:4> having the code value of '0, 1, 0, 1'. Since the value of the most significant bit of the decoded signal is logic '1' while the value of the most significant bit of the fail bank address signal BADD<1:4> is logic '0', the bank information comparison circuit 230 may disable the rupture enable signal RUPEN. Therefore, the fuse F coupled to the fourth word line AWL4 might not be ruptured. According to a prior art, when a defect occurs in a memory cell coupled to a particular word line in the redundancy region of a single memory bank, all of fuses coupled to the particular word line and a particular bit line of a fuse array are ruptured. Therefore, a number of available fuses are reduced. In accordance with an embodiment, as described above, when defect occurs in memory cells of the redundancy regions 112 and 132 of the first and third memory banks 110 and 130, fuses F coupled only to the first and third word lines AWL1 and AWL3 and the second bit line ABL2 are ruptured in the fuse array 150 of FIG. 1 and therefore fuses F coupled to the second and fourth word lines AWL2 and AWL4 and the second bit line ABL2 may be used in the repair operation to the normal regions 121 and 141 of the second and fourth memory banks 120 and 140.

Figure 3:
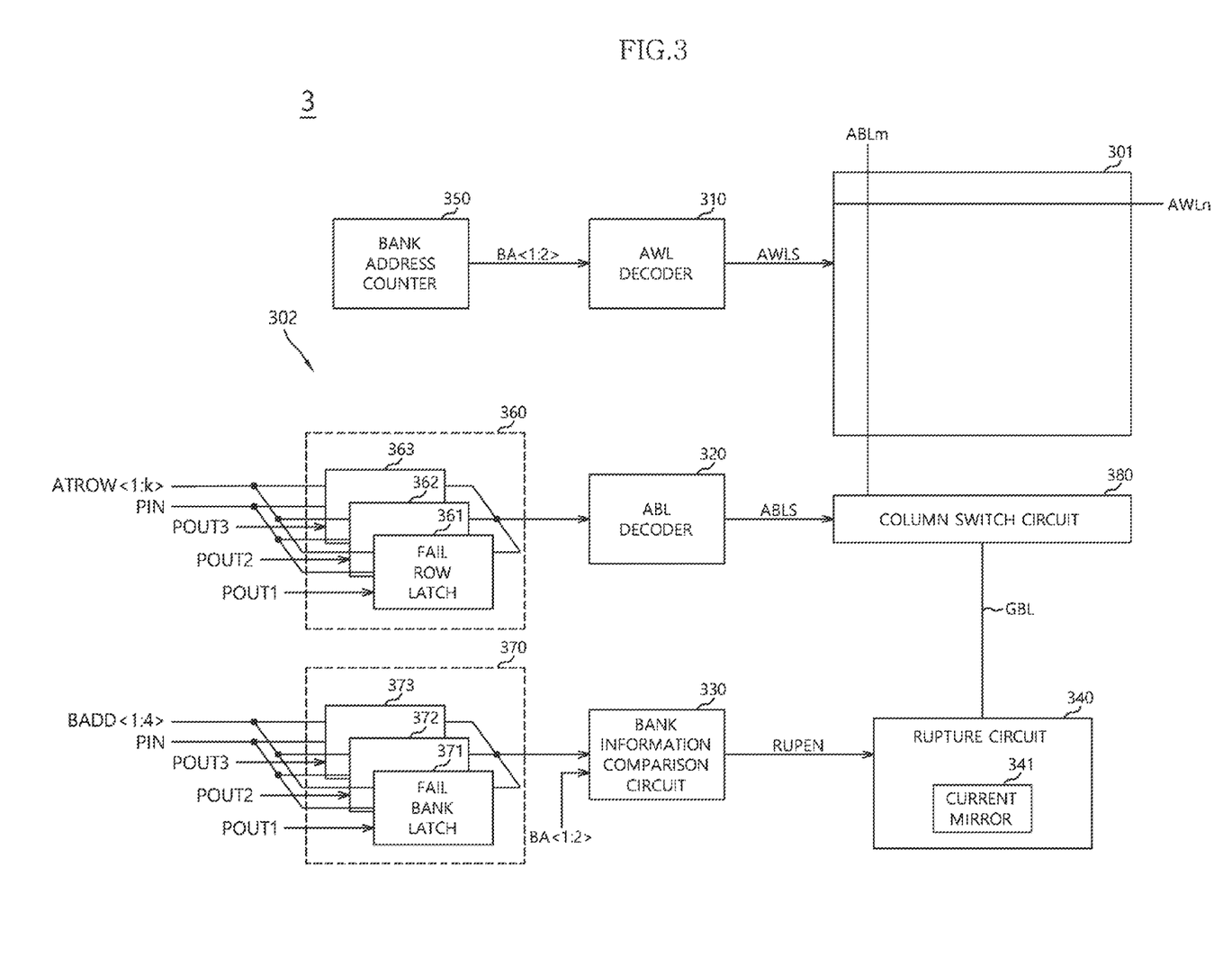
FIG. 3 is a diagram illustrating a representation of an example of a configuration of a semiconductor apparatus including a fuse array and a redundancy repair circuit in accordance with an embodiment of the present disclosure.

FIG. 3 is a diagram illustrating a representation of an example of a configuration of a semiconductor apparatus 3 in accordance with an embodiment of the present disclosure. Referring to FIG. 3, the semiconductor apparatus 3 may have a similar configuration to the semiconductor apparatus 2 illustrated in FIG. 2 and thus the same elements are given similar reference numbers and the repetitive description on the same elements will be avoided. The semiconductor apparatus 3 may include a fuse array 301 and a redundancy repair circuit 302. The fuse array 301 may correspond to the fuse array 150 illustrated in FIG. 1. The redundancy repair circuit 302 of the semiconductor apparatus 3 may include a word line decoder 310, a bit line decoder 320, a bank information comparison circuit 330, a bank address counter 350, a fail row latch circuit 360, a fail bank latch circuit 370 and a rupture circuit 340. The test circuit 160 illustrated in FIG. 1 may generate a plurality of fail row address signals ATROW<1:k> and a plurality of fail bank address signals BADD<1:4> when a plurality of defects occur in the redundancy regions 112, 122, 132 and 142 of the first to fourth memory banks 110, 120, 130 and 140. The fail row latch circuit 360 may receive the plurality of fail row address signals ATROW<1:k>, and may sequentially store the plurality of fail row address signals ATROW<1:k> based on an input control signal PIN. The fail row latch circuit 360 may include a plurality of fail row latches 361, 362 and 363 and the plurality of fail row latches 361, 362 and 363 may respectively store the plurality of fail row address signals ATROW<1:k> based on the input control signal PIN. The fail row latch circuit 360 may selectively output the plurality of fail row address signals ATROW<1:k> stored therein based on a plurality of output control signals POUT1, POUT2 and POUT3. The number of the plurality of output control signals POUT1, POUT2 and POUT3 may correspond to the number of the plurality of fail row latches 361, 362 and 363. The plurality of output control signals POUT1, POUT2 and POUT3 may be implemented with any signal for controlling the repair operation. For example, a control signal such as a test mode signal may be used for the implementation of the plurality of output control signals POUT1, POUT2 and POUT3. The plurality of fail row latches 361, 362 and 363 may output, when the plurality of output control signals POUT1, POUT2 and POUT3 are enabled, the plurality of fail row address signals ATROW<1:k> stored therein to the bit line decoder 320, respectively.

The fail bank latch circuit 370 may receive the plurality of fail bank address signals BADD<1:4>, and may sequentially store the plurality of fail bank address signals BADD<1:4> based on the input control signal PIN. The fail bank latch circuit 370 may include a plurality of fail bank latches 371, 372 and 373, a number of which corresponds to the number of the plurality of fail row latches 361, 362 and 363. The plurality of fail bank latches 371, 372 and 373 may respectively store the plurality of fail bank address signals BADD<1:4> based on the input control signal PIN. The fail bank latch circuit 370 may selectively output the plurality of fail bank address signals BADD<1:4> stored therein based on the plurality of output control signals POUT1, POUT2 and POUT3. The plurality of fail bank latches 371, 372 and 373 may output, when the plurality of output control signals POUT1, POUT2 and POUT3 are enabled, the plurality of fail bank address signals BADD<1:4> stored therein to the bit line decoder 320, respectively.

Described as follows with reference to FIGS. 1 and 3 will be the semiconductor apparatus 1 and 3 in accordance with an embodiment. The test circuit 160 may perform a test operation to the redundancy regions 112, 122, 132 and 142 of the first to fourth memory banks 110, 120, 130 and 140 and may generate the plurality of fail row address signals ATROW<1:k> and the plurality of fail bank address signals BADD<1:4> according to the result of the test operation. For example, it is assumed that there is an occurrence of defects in memory cells coupled to the first word line RWL1 of the first memory bank 110, memory cells coupled to the fourth word line RWL4 of the second memory bank 120 and memory cells coupled to the first and third word lines RWL1 and RWL3 of the third memory bank 130 while no defect occurs in memory cell of the fourth memory bank 140. The test circuit 160 may generate the fail row address signal ATROW<1:k> having a particular code value and the fail bank address signal BADD<1:4> having a code value of '0, 1, 0, 1' to map the first word line RWL1 to a particular bit line of the fuse array 150. For more description, the fail row address signal ATROW<1:k> having the particular code value is referred to as a first fail row address signal and the fail bank address signal BADD<1:4> having the code value of '0, 1, 0, 1' is referred to as a first fail bank address signal. The first fail row address signal may be stored in the first fail row latch 361 based on the input control signal PIN, and the first fail bank address signal may be stored in the first fail bank latch 371 based on the input control signal PIN. The test circuit 160 may generate the fail row address signal ATROW<1:k> having a particular code value different from the first fail row address signal to map the third word line RWL3 to a particular bit line of the fuse array 150. For more description, the fail row address signal ATROW<1:k> having the particular code value different from the first fail row address signal is referred to as a second fail row address signal. Also, the test circuit 160 may generate the fail bank address signal BADD<1:4> having a code value of '0, 1, 0, 0'. For more description, the fail bank address signal BADD<1:4> having the code value of '0, 1, 0, 0' is referred to as a second fail bank address signal. The second fail row address signal may be stored in the second fail row latch 362 based on the input control signal PIN, and the second fail bank address signal may be stored in the second fail bank latch 372 based on the input control signal PIN. The test circuit 160 may generate the fail row address signal ATROW<1:k> having a particular code value different from the first and second fail row address signals to map the fourth word line RWL4 to a particular bit line of the fuse array 150. For clear description, the fail row address signal ATROW<1:k> having the particular code value different from the first and second fail row address signals is referred to as a third fail row address signal. Also, the test circuit 160 may generate the fail bank address signal BADD<1:4> having a code value of '0, 0, 1, 0'. For more description, the fail bank address signal BADD<1:4> having the code value of '0, 0, 1, 0' is referred to as a third fail bank address signal. The third fail row address signal may be stored in the third fail row latch 363 based on the input control signal PIN, and the third fail bank address signal may be stored in the third fail bank latch 373 based on the input control signal PIN.

The redundancy repair circuit 302 may first perform a repair operation to the redundancy region 112 of the first memory bank 110. The word line decoder 310 may select the first word line AWL1 by generating the word line selection signal AWLS based on the bank select address signal BA<1:2>. At this time, the first output control signal POUT1 may be enabled, the first fail row latch 361 may output the first fail row address signal to the bit line decoder 320, and the first fail bank latch 371 may output the first fail bank address signal to the bank information comparison circuit 330. The bit line decoder 320 may select the first bit line ABL1 by generating the bit line selection signal ABLS based on the first fail row address signal. The bank information comparison circuit 330 may compare the decoded signal of the bank select address signal BA<1:2> with the first fail bank address signal. Since the decoded signal of the bank select address signal BA<1:2> may have a code value of '0, 0, 0, 1' and the first fail bank address signal may have the code value '0, 1, 0, 1', the bank information comparison circuit 330 may enable the rupture enable signal RUPEN. The rupture circuit 340 may allow current to flow through the global bit line GBL based on the enabled rupture enable signal RUPEN. Therefore, the fuse F coupled to the first word line AWL1 and the first bit line ABL1 coupled to the global bit line GBL through the column switch 380 may be ruptured by the rupture circuit 340. When the second output control signal POUT2 is enabled, the second fail row latch 362 may output the second fail row address signal to the bit line decoder 320, and the second fail bank latch 372 may output the second fail bank address signal to the bank information comparison circuit 330. The bit line decoder 320 may select the third bit line ABL3 by generating the bit line selection signal ABLS based on the second fail row address signal. The bank information comparison circuit 330 may compare the decoded signal of the bank select address signal BA<1:2> with the second fail bank address signal. Since the decoded signal of the bank select address signal BA<1:2> may have the code value of '0, 0, 0, 1' and the second fail bank address signal may have the code value '0, 1, 0, 0', the bank information comparison circuit 330 may disable the rupture enable signal RU PEN. Therefore, the fuse F coupled to the first word line AWL1 and the third bit lint ABL3 might not be ruptured. When the third output control signal POUT3 is enabled, the third fail row latch 363 may output the third fail row address signal to the bit line decoder 320, and the third fail bank latch 373 may output the third fail bank address signal to the bank information comparison circuit 330. The bit line decoder 320 may select the fourth bit line ABL4 by generating the bit line selection signal ABLS based on the third fail row address signal. The bank information comparison circuit 330 may compare the decoded signal of the bank select address signal BA<1:2> with the third fail bank address signal. Since the decoded signal of the bank select address signal BA<1:2> may have the code value of '0, 0, 0, 1' and the third fail bank address signal may have the code value '0, 0, 1, 0', the bank information comparison circuit 330 may disable the rupture enable signal RUPEN. Therefore, the fuse F coupled to the first word line AWL1 and the fourth bit lint ABL4 might not be ruptured.

After that, the bank address counter 350 may increase the code value of the bank select address signal BA<1:2> by an amount of 1 and the redundancy repair circuit 302 may perform a repair operation to the redundancy region 122 of the second memory bank 120. The word line decoder 310 may select the second word line AWL2 by generating the word line selection signal AWLS based on the bank select address signal BA<1:2>. At this time, the first output control signal POUT1 may be enabled, the first fail row latch 361 may output the first fail row address signal to the bit line decoder 320, and the first fail bank latch 371 may output the first fail bank address signal to the bank information comparison circuit 330. The bit line decoder 320 may select the first bit line ABL1 by generating the bit line selection signal ABLS based on the first fail row address signal. The bank information comparison circuit 330 may compare the decoded signal of the bank select address signal BA<1:2> with the first fail bank address signal. Since the decoded signal of the bank select address signal BA<1:2> may have a code value of '0, 0, 1, 0' and the first fail bank address signal may have the code value '0, 1, 0, 1', the bank information comparison circuit 330 may disable the rupture enable signal RUPEN. Therefore, the fuse F coupled to the second word line AWL2 and the first bit lint ABL1 might not be ruptured. When the second output control signal POUT2 is enabled, the second fail row latch 362 may output the second fail row address signal to the bit line decoder 320, and the second fail bank latch 372 may output the second fail bank address signal to the bank information comparison circuit 330. The bit line decoder 320 may select the third bit line ABL3 by generating the bit line selection signal ABLS based on the second fail row address signal. The bank information comparison circuit 330 may compare the decoded signal of the bank select address signal BA<1:2> with the second fail bank address signal. Since the decoded signal of the bank select address signal BA<1:2> may have the code value of '0, 0, 1, 0' and the second fail bank address signal may have the code value '0, 1, 0, 0', the bank information comparison circuit 330 may disable the rupture enable signal RUPEN. Therefore, the fuse F coupled to the second word line AWL2 and the third bit lint ABL3 might not be ruptured. When the third output control signal POUT3 is enabled, the third fail row latch 363 may output the third fail row address signal to the bit line decoder 320, and the third fail bank latch 373 may output the third fail bank address signal to the bank information comparison circuit 330. The bit line decoder 320 may select the fourth bit line ABL4 by generating the bit line selection signal ABLS based on the third fail row address signal. The bank information comparison circuit 330 may compare the decoded signal of the bank select address signal BA<1:2> with the third fail bank address signal. Since the decoded signal of the bank select address signal BA<1:2> may have the code value of '0, 0, 1, 0' and the third fail bank address signal may have the code value '0, 0, 1, 0', the bank information comparison circuit 330 may enable the rupture enable signal RUPEN. The rupture circuit 340 may allow current to flow through the global bit line GBL based on the enabled rupture enable signal RUPEN. Therefore, the fuse F coupled to the second word line AWL2 and the fourth bit line ABL4 coupled to the global bit line GBL through the column switch 380 may be ruptured by the rupture circuit 340.

After that, the bank address counter 350 may increase the code value of the bank select address signal BA<1:2> by an amount of 1 and the redundancy repair circuit 302 may perform a repair operation to the redundancy region 132 of the third memory bank 130. The word line decoder 310 may select the third word line AWL3 by generating the word line selection signal AWLS based on the bank select address signal BA<1:2>. At this time, the first output control signal POUT1 may be enabled, the first fail row latch 361 may output the first fail row address signal to the bit line decoder 320, and the first fail bank latch 371 may output the first fail bank address signal to the bank information comparison circuit 330. The bit line decoder 320 may select the first bit line ABL1 by generating the bit line selection signal ABLS based on the first fail row address signal. The bank information comparison circuit 330 may compare the decoded signal of the bank select address signal BA<1:2> with the first fail bank address signal. Since the decoded signal of the bank select address signal BA<1:2> may have a code value of '0, 1, 0, 0' and the first fail bank address signal may have the code value '0, 1, 0, 1', the bank information comparison circuit 330 may enable the rupture enable signal RUPEN. The rupture circuit 340 may allow current to flow through the global bit line GBL based on the enabled rupture enable signal RUPEN. Therefore, the fuse F coupled to the third word line AWL3 and the first bit line ABL1 coupled to the global bit line GBL through the column switch 380 may be ruptured by the rupture circuit 340. When the second output control signal POUT2 is enabled, the second fail row latch 362 may output the second fail row address signal to the bit line decoder 320, and the second fail bank latch 372 may output the second fail bank address signal to the bank information comparison circuit 330. The bit line decoder 320 may select the third bit line ABL3 by generating the bit line selection signal ABLS based on the second fail row address signal. The bank information comparison circuit 330 may compare the decoded signal of the bank select address signal BA<1:2> with the second fail bank address signal. Since the decoded signal of the bank select address signal BA<1:2> may have the code value of '0, 1, 0, 0' and the second fail bank address signal may have the code value '0, 1, 0, 0', the bank information comparison circuit 330 may enable the rupture enable signal RUPEN. The rupture circuit 340 may allow current to flow through the global bit line GBL based on the enabled rupture enable signal RUPEN.

Therefore, the fuse F coupled to the third word line AWL3 and the third bit line ABL3 coupled to the global bit line GBL through the column switch 380 may be ruptured by the rupture circuit 340. When the third output control signal POUT3 is enabled, the third fail row latch 363 may output the third fail row address signal to the bit line decoder 320, and the third fail bank latch 373 may output the third fail bank address signal to the bank information comparison circuit 330. The bit line decoder 320 may select the fourth bit line ABL4 by generating the bit line selection signal ABLS based on the third fail row address signal. The bank information comparison circuit 330 may compare the decoded signal of the bank select address signal BA<1:2> with the third fail bank address signal. Since the decoded signal of the bank select address signal BA<1:2> may have the code value of '0, 1, 0, 0' and the third fail bank address signal may have the code value '0, 0, 1, 0', the bank information comparison circuit 330 may disable the rupture enable signal RUPEN. Therefore, the fuse F coupled to the third word line AWLS and the third bit lint ABL3 might not be ruptured.

After that, the bank address counter 350 may increase the code value of the bank select address signal BA<1:2> by an amount of 1 and the redundancy repair circuit 302 may perform a repair operation to the redundancy region 142 of the fourth memory bank 140. Since no defect occurs in the redundancy region 140 of the fourth memory bank 140, the bank information comparison circuit 330 may disable the rupture enable signal RUPEN even when the bank information comparison circuit 330 receives the first to third fail bank address signals. Therefore, the fuse F coupled to the fourth word line AWL4 might not be ruptured. In accordance with various embodiments of the present disclosure, repair operations may be sequentially performed to the respective memory banks and thus a number of fuses, which are unnecessarily disabled, may be reduced. Further, the fail row address signal ATROW<1:k> may be commonly used by generating the fail bank address signal BADD<1:4> and thus the test operation time may be drastically reduced.

While certain embodiments have been described above, it will be understood to those skilled in the art that the embodiments described are by way of example only. Accordingly, the semiconductor apparatus for repairing redundancy region should not be limited based on the described embodiments. Rather, the semiconductor apparatus for repairing redundancy region described herein should only be limited in light of the claims that follow when taken in conjunction with the above description and accompanying drawings.

What is claimed is:
1. A semiconductor apparatus comprising:
a fuse array;
a word line decoder configured to select a word line of the fuse array based on a bank select address signal;
a bit line decoder configured to select a bit line of the fuse array based on a fail row address signal;
a bank information comparison circuit configured to generate a rupture enable signal by comparing a fail bank address signal with the bank select address signal; and
a rupture circuit configured to rupture a fuse coupled to the selected word line and the selected bit line based on the rupture enable signal.
2. The semiconductor apparatus of claim 1, wherein the bank information comparison circuit enables the rupture enable signal when the fail bank address signal and the bank select address signal correspond to each other, and disables the rupture enable signal when the fail bank address signal and the bank select address signal do not correspond to each other.
3. The semiconductor apparatus of claim 1, further comprising a bank address counter configured to sequentially change a code value of the bank select address signal at each predetermined time.
4. The semiconductor apparatus of claim 1, further comprising:
a fail row latch configured to latch the fail row address signal.
5. The semiconductor apparatus of claim 1, further comprising:
a fail bank latch configured to latch the fail bank address signal.
6. The semiconductor apparatus of claim 1, further comprising a column switch circuit configured to couple the selected bit line to the rupture circuit.
7. A semiconductor apparatus comprising:
a plurality of memory banks each including a normal region and a redundancy region;
a test circuit configured to test the redundancy region to detect when a defect occurs in a memory cell and generate a fail row address signal and a fail bank address signal based on the detection of the defect; and
a redundancy repair circuit configured to select a fuse of a fuse array based on the fail row address signal and a bank select address signal, and to rupture the selected fuse when the fail bank address signal corresponds to the bank select address signal.
8. The semiconductor apparatus of claim 7, wherein the redundancy repair circuit includes:
a word line decoder configured to select a word line of the fuse array based on the bank select address signal;
a bit line decoder configured to select a bit line of the fuse array based on the fail row address signal;
a bank information comparison circuit configured to generate a rupture enable signal by comparing the fail bank address signal with the bank select address signal; and
a rupture circuit configured to rupture a fuse coupled to the selected word line and the selected bit line based on the rupture enable signal.
9. The semiconductor apparatus of claim 8, wherein the bank information comparison circuit enables the rupture enable signal when the fail bank address signal and the bank select address signal correspond to each other, and disables the rupture enable signal when the fail bank address signal and the bank select address signal do not correspond to each other.
10. The semiconductor apparatus of claim 8, further comprising a bank address counter configured to sequentially change a code value of the bank select address signal at each predetermined time.
11. The semiconductor apparatus of claim 8, further comprising:
a fail row latch configured to latch the fail row address signal.
12. The semiconductor apparatus of claim 8, further comprising:
a fail bank latch configured to latch the fail bank address signal.
13. The semiconductor apparatus of claim 8, further comprising a column switch circuit configured to couple the selected bit line to the rupture circuit.
14. A semiconductor apparatus comprising:
a word line decoder configured to select a word line based on a bank select address signal;

a fail row latch circuit configured to sequentially store a plurality of fail row address signals based on an input control signal, and to output the plurality of fail row address signals based on a plurality of output control signals;

a bit line decoder configured to select a bit line based on the fail row address signal;

a fail bank latch circuit configured to sequentially store a plurality of fail bank address signals based on the input control signal, and to output the plurality of fail bank address signals based on the plurality of output control signals;

a bank information comparison circuit configured to generate a rupture enable signal by comparing the fail bank address signal output from the fail bank latch circuit with the bank select address signal; and a rupture circuit configured to rupture a fuse coupled to the selected word line and the selected bit line based on the rupture enable signal.

15. The semiconductor apparatus of claim 14, wherein the fail row latch circuit includes a plurality of fail row latches configured to sequentially store the plurality of fail row address signals based on the input control signal, and to output the stored fail row address signals when the corresponding output control signals are enabled.

16. The semiconductor apparatus of claim 14, wherein the fail bank latch circuit includes a plurality of bank latches configured to sequentially store the plurality of fail bank address signals based on the input control signal, and to output the plurality of fail bank address signals when the corresponding output control signals are enabled.

17. The semiconductor apparatus of claim 14, wherein the bank information comparison circuit enables the rupture enable signal when the fail bank address signal and the bank select address signal correspond to each other, and disables the rupture enable signal when the fail bank address signal and the bank select address signal do not correspond to each other.

18. The semiconductor apparatus of claim 14, further comprising a bank address counter configured to sequentially change a code value of the bank select address signal at each predetermined time.

19. The semiconductor apparatus of claim 14, further comprising a column switch circuit configured to couple the selected bit line to the rupture circuit.

* * * * *